(12) United States Patent
Lutze et al.

(10) Patent No.: US 7,834,386 B2
(45) Date of Patent: Nov. 16, 2010

(54) NON-VOLATILE MEMORY WITH EPITAXIAL REGIONS FOR LIMITING CROSS COUPLING BETWEEN FLOATING GATES

(75) Inventors: Jeffrey W. Lutze, San Jose, CA (US); Nima Mokhlesi, Los Gatos, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 12/024,808

(22) Filed: Feb. 1, 2008

(65) Prior Publication Data

US 2008/0116502 A1    May 22, 2008

Related U.S. Application Data

(63) Continuation of application No. 10/778,634, filed on Feb. 13, 2004, now Pat. No. 7,355,237.

(51) Int. Cl.
*H01L 29/788* (2006.01)
(52) U.S. Cl. ........................ 257/315; 257/320
(58) Field of Classification Search ........... 257/261, 257/296–298, 302, 311–326, 330, E21, E27, 257/E29, E27.078, E29.3, E21.179, E21.18, 257/E21.181, E21.182, E21.209, E21.21, 257/E21.422, E21.423, E21.679, E21.68, 257/E21.681, E21.682, E21.683, E21.684, 257/E21.685, E21.686, E21.687, E21.688, 257/E21.689, E21.69, E21.691, E21.692, 257/E21.693, E21.694
See application file for complete search history.

(56) References Cited

U.S. PATENT DOCUMENTS 4,831,628 A    5/1989   Tsang
5,043,940 A    8/1991   Harari
5,095,344 A    3/1992   Harari
5,172,338 A    12/1992  Mehrotra et al.
5,279,982 A *  1/1994   Crotti ........................ 438/586
5,343,063 A    8/1994   Yuan et al.

(Continued)

FOREIGN PATENT DOCUMENTS

JP          04167472         6/1992

(Continued)

OTHER PUBLICATIONS

Augendre, et al., "Elevated Source/drain by Sacrificial Selective Epitaxy for High Performance Deep Submicron CMOS: Process Window versus Complexity," IEEE Transactions on Electron Devices, vol. 47, No. 7, Jul. 2000, pp. 1484-1491.

(Continued)

*Primary Examiner*—Wai-Sing Louie
*Assistant Examiner*—Sue Tang
(74) *Attorney, Agent, or Firm*—Vierra Magen Marcus & DeNiro LLP

(57) ABSTRACT

A memory system is disclosed that includes a set of non-volatile storage elements. Each of the non-volatile storage elements includes source/drain regions at opposite sides of a channel in a substrate and a floating gate stack above the channel. The memory system also includes a set of shield plates positioned between adjacent floating gate stacks and electrically connected to the source/drain regions for reducing coupling between adjacent floating gates. The shield plates are selectively grown on the active areas of the memory without being grown on the inactive areas. In one embodiment, the shield plates are epitaxially grown silicon positioned above the source/drain regions.

8 Claims, 13 Drawing Sheets

U.S. PATENT DOCUMENTS

| | | | |
|---|---|---|---|
| 5,439,838 A * | 8/1995 | Yang | 438/258 |
| 5,570,315 A | 10/1996 | Tanaka et al. | |
| 5,677,872 A | 10/1997 | Samachisa et al. | |
| 5,682,055 A | 10/1997 | Huang et al. | |
| 5,774,397 A | 6/1998 | Endoh et al. | |
| 5,815,438 A | 9/1998 | Haddad et al. | |
| 5,867,429 A | 2/1999 | Chen et al. | |
| 5,877,980 A | 3/1999 | Mang et al. | |
| 5,886,924 A | 3/1999 | Kim et al. | |
| 5,890,192 A | 3/1999 | Lee | |
| 5,895,949 A | 4/1999 | Endoh et al. | |
| 5,936,887 A | 8/1999 | Choi et al. | |
| 5,990,514 A | 11/1999 | Choi et al. | |
| 6,044,017 A | 3/2000 | Lee et al. | |
| 6,046,935 A | 4/2000 | Takeuchi et al. | |
| 6,093,605 A | 7/2000 | Mang et al. | |
| 6,103,573 A | 8/2000 | Harari et al. | |
| 6,151,248 A | 11/2000 | Harari | |
| 6,207,992 B1 | 3/2001 | Mori | |
| 6,222,762 B1 | 4/2001 | Guterman | |
| 6,246,607 B1 | 6/2001 | Mang et al. | |
| 6,417,538 B1 | 7/2002 | Choi | |
| 6,455,362 B1 * | 9/2002 | Tran et al. | 438/194 |
| 6,456,528 B1 | 9/2002 | Chen | |
| 6,522,580 B2 | 2/2003 | Chen | |
| 6,624,488 B1 | 9/2003 | Kim | |
| 6,630,392 B2 | 10/2003 | Kim | |
| 6,689,654 B2 | 2/2004 | Kim et al. | |
| 6,746,918 B2 | 6/2004 | Wu | |
| 6,788,573 B2 | 9/2004 | Choi | |
| 6,888,755 B2 | 5/2005 | Harari | |
| 6,894,930 B2 | 5/2005 | Chien et al. | |
| 6,917,542 B2 | 7/2005 | Chen | |
| 7,057,216 B2 * | 6/2006 | Ouyang et al. | 257/194 |
| 7,073,103 B2 | 7/2006 | Gongwer | |
| 7,105,406 B2 | 9/2006 | Lutze et al. | |
| 7,115,949 B2 * | 10/2006 | Hoefler et al. | 257/350 |
| 7,148,538 B2 * | 12/2006 | Forbes | 257/316 |
| 7,154,779 B2 * | 12/2006 | Mokhlesi et al. | 365/185.01 |
| 7,221,008 B2 | 5/2007 | Matamis et al. | |
| 7,237,074 B2 | 6/2007 | Guterman | |
| 2003/0190784 A1 | 10/2003 | Chang | |
| 2003/0210582 A1 | 11/2003 | Kinoshita | |
| 2005/0180186 A1 | 8/2005 | Lutze et al. | |

FOREIGN PATENT DOCUMENTS

| | | |
|---|---|---|
| JP | 2002057228 | 2/2002 |
| KR | 1019960012483 | 11/1997 |
| KR | 1019980034175 | 8/2001 |
| KR | 102001013072 | 10/2002 |

OTHER PUBLICATIONS

Chan, et al., "A True Single-Transistor Oxide-Nitride-Oxide EEPROM Device," IEEE Electron Device Letters, vol. EDL-8, No. 3, Mar. 1987, pp. 93-95.

Choi, et al., "A Novel Booster Plate Technology in High Density NAND Flash Memories for Voltage Scaling-Down and Zero Program Disturbance," IEEE Symposium on VLSI Technology Digest of Technical Papers, 1996, pp. 238-239.

Choi, et al., "A Triple Polysilicon Stacked Flash Memory Cell With Wordline Self-Boosting Programming", IEEE, 1997, pp. 283-286.

Gannavaram et al., "Low Temperature Recessed Junction Selective Silicon-Germanium Source/Drain Technology for sub-70 mnCMOS," IEDM Tech Digest, 2000, p. 437.

Kim, et al., "Fast Parallel Programming of Multi-Level NAND Flash Memory Cells Using the Booster-Line Technology", Symposium on VLSI Technology Digest of Technical Papers, 1997, pp. 65-66.

Murota, et al., "Low-Temperature Silicon Selective Deposition and Epitaxy on Silicon Using the Termal Deomposition of Silane Under Ultraclean Environment," Appl. Phys. Letters. vol. 54, No. 11, Mar. 13, 1989, p. 1007.

Nozaki, et al., "A 1-Mb EEPROM With NONOS Memory Cell for Semiconductor Disk Application," IEEE Journal of Solid-State Circuits, vol. 26, No. 4, Apr. 1991, pp. 497-501.

Regolini et al., "Selective Epitaxial Silicon Growth in the 650-1100C Range in a Reduced Pressure Chemical Vapor Depotiion Reactor Using Dichlorosilane," Appl. Phys. Letters, vol. 54, No. 7, Feb. 13, 1989, p. 658.

Rodder, "Raised Source/Drain MOSFET with Dual Sidewall Spacers," IEEE Electron Device Letters, vol. 12, No. 3, Mar. 1991, pp. 89-91.

Satoh, et al., "A Novel Channel Boost Capacitance (CBC) Cell Technology with Low Program Disturbance Suitable for Fast Programming 4Gbit NAND Flash Memories", IEEE Symposium on VLSI Technology Digest of Technical Papers, 1998, pp. 108-109.

Suh, et al., "A 3.3V 32 Mb NAND Flash Memory With Incremental Step Pulse Programming Scheme," IEEE international Solid-State Circuits Conference, Digest of Technical Papers, Feb. 1995, pp. 94-95, 305-306, 128-129, and 350.

Tsai, et al. "DIBL Considerations of Extended Drain Structure for 0.1 µm MOSFET's," IEEE Electron Device Letters, vol. 17, No. 7, Jul. 1996, pp. 331-333.

U.S. Appl. No. 12/024,787, titled "Method for Forming Non-volatile Memory With Shield Plates for Limiting Cross Coupling Between Floating Gates", filed Feb. 1, 2008.

Office Action dated Nov. 30, 2009, U.S. Appl. No. 12/024,787, filed Feb. 1, 2008.

Office Action dated Aug. 3, 2009, U.S. Appl. No. 12/024,787, filed Feb. 1, 2008.

Chinese Office Action (English translation) dated Aug. 15, 2008 for Chinese Appl. No. 200580008908.6.

Amendment dated Dec. 22, 2009, U.S. Appl. No. 12/024,787, filed Feb. 1, 2008.

Office Action dated Feb. 5, 2010 in U.S. Appl. No. 12/024,787, filed Feb. 1, 2008.

* cited by examiner

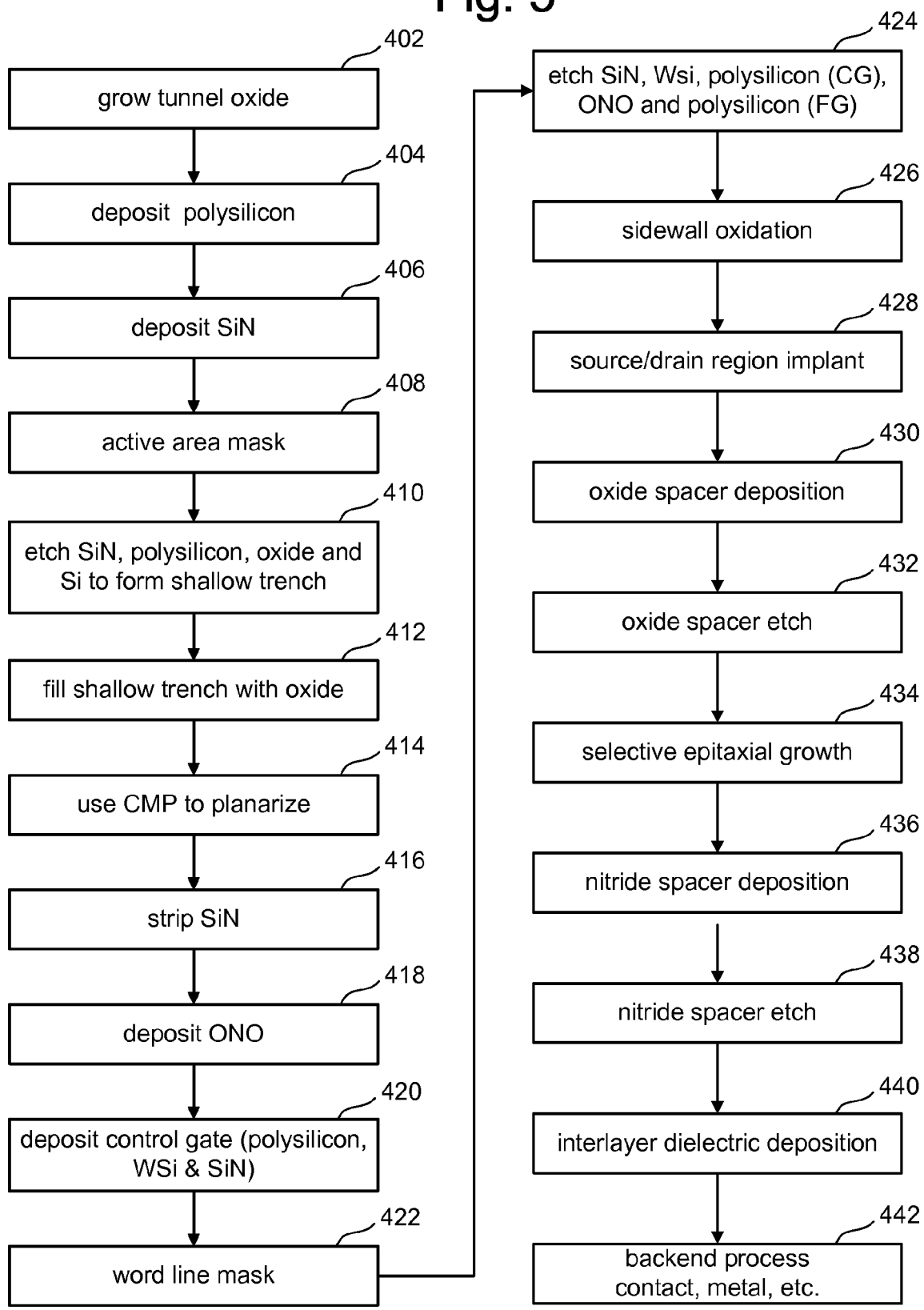

NON-VOLATILE MEMORY WITH EPITAXIAL REGIONS FOR LIMITING CROSS COUPLING BETWEEN FLOATING GATES

CROSS-REFERENCE TO RELATED APPLICATIONS

This is a continuation application of, commonly assigned, U.S. patent application Ser. No. 10/778,634, filed Feb. 13, 2004, titled "Shield Plate For Limiting Cross Coupling Between Floating Gates," (issued as U.S. Pat. No. 7,355,237 on Apr. 8, 2008), incorporated herein by reference.

BACKGROUND OF THE INVENTION

1. Field of the Invention

The present invention relates to non-volatile memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Typical EEPROMs and flash memories utilize a memory cell with a floating gate that is provided above a channel region in a semiconductor substrate. The floating gate is separated from the channel region by a dielectric region. For example, the channel region is positioned in a p-well between source and drain regions. A control gate is provided over and separated from the floating gate. The threshold voltage of the memory cell is controlled by the amount of charge that is retained on the floating gate. That is, the level of charge on the floating gate determines the minimum amount of voltage that must be applied to the control gate before the memory cell is turned on to permit conduction between its source and drain.

Some EEPROM and flash memory devices have a floating gate that is used to store two ranges of charges and, therefore, the memory cell can be programmed/erased between two states (e.g., a binary memory cell). A multi-bit or multi-state flash memory cell is implemented by identifying multiple, distinct threshold voltage ranges within a device. Each distinct threshold voltage range corresponds to predetermined values for the set of data bits. To achieve proper data storage for a multi-state cell, the multiple ranges of threshold voltage levels should be separated from each other by sufficient margin so that the level of the memory cell can be read, programmed or erased in an unambiguous manner.

When programming typical prior art or flash memory devices, a program voltage is applied to the control gate and the bit line is grounded. Electrons from the channel are injected into the floating gate. When electrons accumulate in the floating gate, the floating gate becomes negatively charged and the threshold voltage of the memory cell as seen from the control gate is raised.

Typically, the program voltage Vpgm applied to the control gate is applied as a series of pulses. The magnitude of the pulses is increased with each successive pulse by a predetermined step size (e.g., 0.2 V). In the periods between the pulses, verify operations are carried out. That is, the programming level of each memory cell of a group of memory cells being programmed in parallel is read between each programming pulse to determine whether it is equal to or greater than each individual memory cell's targeted verify level to which it is being programmed. The memory cells that are verified to be sufficiently programmed are locked out, for example, by raising the bit line voltage from 0 to Vdd to stop the programming process for those memory cells.

Typical prior art memory cells are erased by raising the p-well to an erase voltage (e.g., 20 V) and grounding the control gate. The source and drain are floating. Electrons are transferred from the floating gate to the p-well region and the threshold voltage is lowered.

One example of a flash memory system uses the NAND structure, which includes arranging multiple floating gate transistors in series between two select gates. The transistors in series and the select gates are referred to as a NAND string. A typical architecture for a flash memory system using a NAND structure will include several NAND strings. For example, FIG. 1 shows three NAND strings 202, 204 and 206 of a memory array having many more NAND strings. Each of the NAND strings of FIG. 1 includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each NAND string is connected to the source line by its select transistor (e.g., select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 252. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array.

Relevant examples of NAND type flash memories and their operation are provided in the following U.S. patents/patent applications, all of which are incorporated herein by reference in their entirety: U.S. Pat. Nos. 5,570,315; 5,774,397, 6,046,935, 6,456,528 and U.S. patent application. Ser. No. 09/893,277 (now U.S. Pat. No. 6,522,580). Other types of flash memory devices can also be used with the present invention. For example, the following patents describe NOR type flash memories and are incorporated herein by reference in their entirety: U.S. Pat. Nos. 5,095,344; 5,172,338; 5,890,192 and 6,151,248. Another example of a flash memory type is found in U.S. Pat. No. 6,151,248, incorporated herein by reference in its entirety.

One difficulty with non-volatile memory arises from floating gate to floating gate coupling. It has been found that an electric field from adjacent floating gates to the floating gate of a memory cell being read affects the apparent threshold voltage of the memory cell being read. A difficulty is that, after a first memory cell is programmed and verified, adjacent memory cells can be either programmed or erased which changes the effect that the adjacent memory cells have on the first memory cell. When the first memory cell is subsequently read, its apparent threshold voltage may be different than when initially programmed.

Consider, for example, FIG. 1. Assume that memory cell 244 is programmed. Subsequently, memory cell 242 is programmed so that its threshold voltage is changed. If memory cell 244 is read after memory cell 242 was programmed, the electric field from the charge stored on the floating gate of memory cell 242 will cause the threshold voltage of memory cell 244 to appear to be different than it was prior to programming memory cell 242. This effect is due to coupling between adjacent floating gates on neighboring word lines.

Floating gate to floating gate coupling can also exist between adjacent floating gates on neighboring bit lines. For example, assume that memory cell 244 is programmed. Subsequently, memory cell 252 is programmed so that its threshold voltage is changed. If memory cell 244 is read after memory cell 252 is programmed, the electric field from the charge stored on the floating gate of memory cell 252 will cause the threshold voltage of memory cell 244 to appear to be different than it was prior to programming memory 252.

SUMMARY OF THE INVENTION

The present invention, roughly described, pertains to a non-volatile memory system that includes a set of floating gate stacks, source/drain regions adjacent to the floating gates and shields positioned between at least a subset of the floating gate stacks and electrically connected to the source/drain regions. The shields reduce the floating gate to floating gate coupling between adjacent floating gates on neighboring word lines. It has been found that the floating gate to floating gate coupling between adjacent floating gates on neighboring word lines is more severe than the floating gate to floating gate coupling between adjacent floating gates on neighboring bit lines.

Another embodiment of the present invention includes a set of non-volatile storage devices and shields. The non-volatile storage devices include a source and a drain at opposite sides of a channel in a substrate, a first dielectric layer positioned adjacent the channel and a floating gate positioned adjacent the first dielectric. The shields which are epitaxial layers. For example, the shields may be epitaxially grown silicon. These epitaxial layers are positioned between adjacent floating gates in order to reduce floating gate to floating gate coupling. In one embodiment, each of the shields are position in the active areas of the array between only two adjacent floating gates stacks.

These and other objects and advantages of the present invention will appear more clearly from the following description in which the preferred embodiment of the invention has been set forth in conjunction with the drawings.

BRIEF DESCRIPTION OF THE DRAWINGS

FIG. 5 is a flow chart describing one embodiment of a process for making a non-volatile memory cell array.

DETAILED DESCRIPTION

Figure 1:
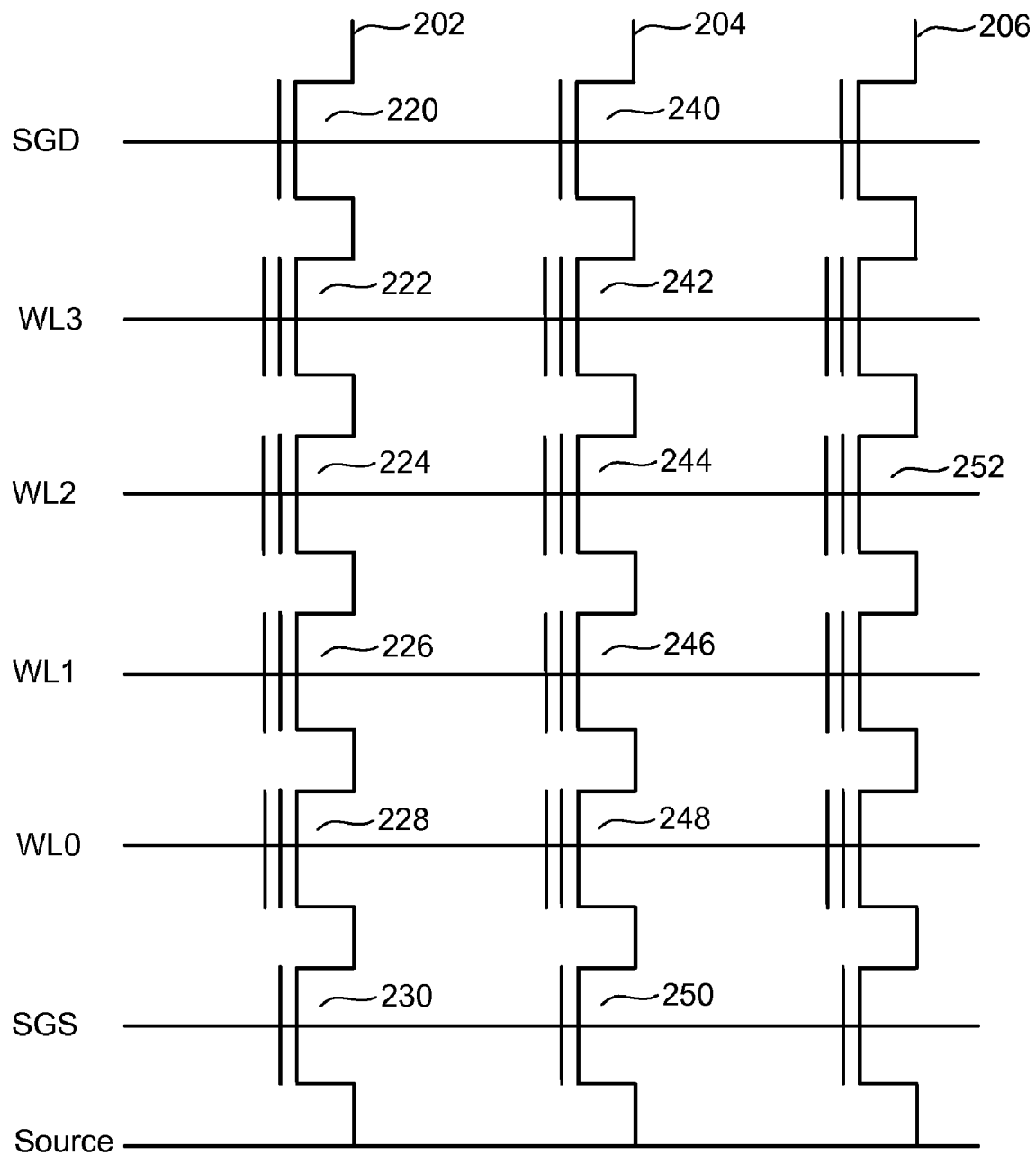
FIG. 1 is a circuit diagram depicting three NAND strings.
Figure 2:
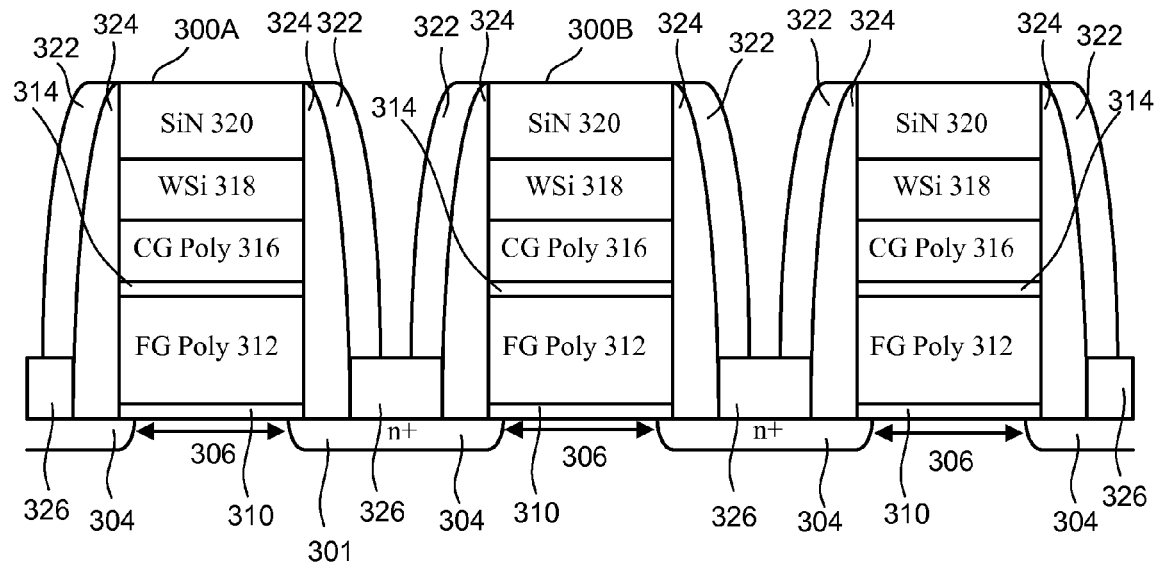
FIG. 2 depicts the structure of a non-volatile memory device.

FIG. 2 is a two-dimensional block diagram of one embodiment of a flash memory cell. Although a flash memory cell is discussed, other types of non-volatile memory can also be used in accordance with the present invention. The memory cell of FIG. 2 includes a triple well (not depicted in the figures) comprising a P substrate, an N-well and a P-well. Within the P-well are N+ diffusion regions 304, which serve as source/drains. Whether N+ diffusion regions 304 are labeled as source regions or drain regions is somewhat arbitrary; therefore, the source/drain regions 304 can be thought of as source regions, drain regions, or both. In a NAND string, a source/drain region 304 acts as a source for one memory cell while serving as a drain for an adjacent memory cell. For example, the source/drain region indicated by reference number 301 is a drain for the floating gate stack 300A and a source for the floating gate stack 300B.

Between source/drain regions 304 is the channel 306. Above channel 306 is a first dielectric area 310. In one embodiment dielectric layer 310 is made of $SiO_2$. Other dielectric materials can also be used. Above dielectric layer 310 is floating gate 312. The floating gate, under low voltage operating conditions associated with read or bypass operations, is electrically insulated/isolated from channel 306 by dielectric layer 310. Floating gate 312 is typically made from poly-silicon that is doped with n-type dopants; however, other conducting materials, such as metals, can also be used. Above floating gate 312 is second dielectric layer 314. Above dielectric layer 314 is the control gate, which includes three layers: poly-silicon layer 316, Tungsten Silicide (WSi) layer 318 and Silicon Nitride (SiN) layer 320. WSi layer 318 is a lower resistance layer. SiN layer 320 is an insulator. The floating gate and the control gate can also be composed of one or more layers of poly-silicon, Tungsten, Titanium, or other metals or semiconductors.

Dielectric layer 310, floating gate 312, dielectric layer 314, and control gate layers 316-320 comprise a floating gate stack. An array of memory cells will have many such floating gate stacks. In other embodiments, a floating gate stack may have more or less components than depicted in FIG. 2; however, a floating gate stack is so named because it includes a floating gate as well as other components.

The memory cell of FIG. 2 also includes oxide spacers 324 along both sides of the floating gate stack. In one embodiment, oxide spacers 324 are tapered so that they are thinner at the top of Silicon Nitride (SiN) layer 320 than they are at dielectric 310. Next to oxide spacers 324 are Silicon Nitride (SiN) spacers 322. In relation to the floating gate stacks, SiN spacers 322 are along both sides of the floating gate stack, outside of oxide spacers 324. The spacer 324 of floating gate stack 300A is a first spacer, the spacer 324 of floating gate 300B is a second spacer, the spacer 322 of floating gate stack 300A is a third spacer, and the spacer 322 of floating gate stack 300B is a fourth spacer. In an alternative embodiment, the floating gate stack is trapezoidal.

Between SiN spacers 322 of neighboring floating gate stacks are epitaxial layers 326. An epitaxial layer is a semiconductor layer having the same crystalline orientation as the substrate on which it is grown. In one embodiment, epitaxial layers 326 are epitaxially grown silicon positioned over and electrically connected to source/drain regions 304. Epitaxial layers 326 are considered to be positioned between floating gate stacks, even is there is some amount of overlap between the stacks and the epitaxial layers.

Epitaxial layers 326 reduce the capacitive coupling between neighboring floating gates on a bit line by acting as shield plates that terminate the electric field from a floating gate, thereby shielding a neighboring floating gate from the effects of the electric field. For example, the epitaxial layer above source/drain region 301 will act to shield the floating gate of floating gate stack 300B from the electric field (e.g., the capacitive coupling) of the floating gate of the floating gate stack 300A. The electric field lines will terminate at epitaxial layers 326. The epitaxial layers 326, which are conductors, are electrically connected to the source/drain regions 304, which are at controlled potentials (not state dependent) so the effect on the apparent threshold voltage is consistent. In one embodiment, the epitaxial layers 326 do not have any electrical connections other than the connections to the source/drain regions 304.

The epitaxially grown silicon layers can also be used to create a raised source/drain structure, thereby, increasing the effective channel length of the device and allowing higher doped junctions without causing short channel effects.

In one embodiment, the epitaxial layers can be doped like the source/drain regions so that the junction depth of the source/drain regions is smaller. Therefore, there would be a greater effective channel length and better short channel effect.

One side effect of the above approach is the increased floating gate to substrate capacitance. This increases the overall floating gate capacitance and, thus, decreases the control gate to floating gate coupling factor. Another side effect is that the epitaxial layers cause an increased coupling between the word line and the channel, which is beneficial for boosting purposes in order to inhibit programming of non-selected memory cells.

Figure 3:
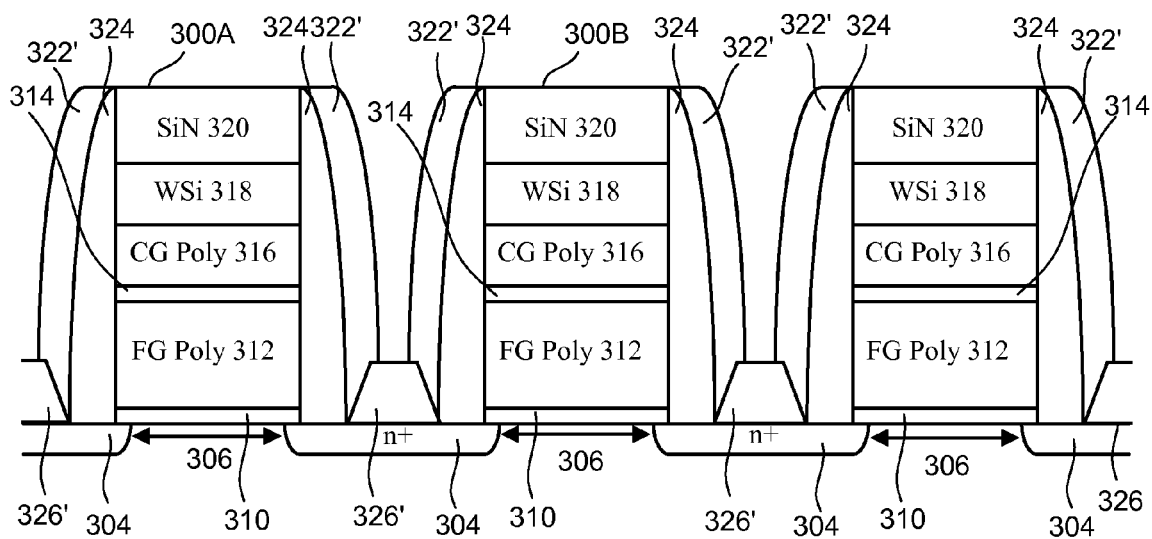
FIG. 3 depicts the structure of a non-volatile memory device.

FIG. 3 is a two-dimensional block diagram of second embodiment of a flash memory cell. The flash memory cell of FIG. 3 is similar to the flash memory cell of FIG. 2, except that the epitaxial layer 326' of FIG. 3 is trapezoidal in shape, while the epitaxial layer 326 of FIG. 2 is more rectangular in shape. Other shapes can also be used. Note also that SiN space 322' of FIG. 3 has a change in shape to accommodate the change in shape of epitaxial layer 326'.

Figure 4:
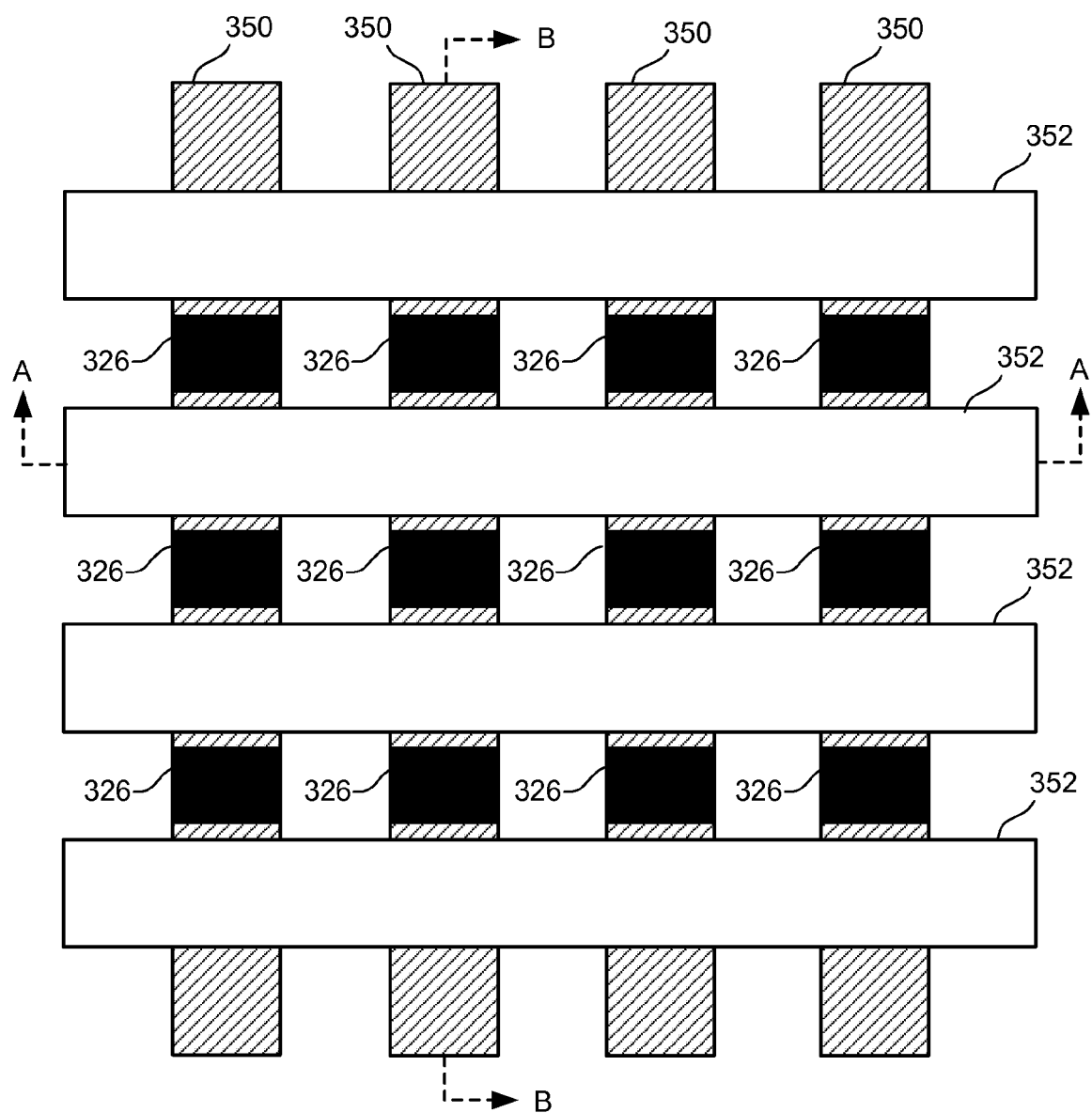
FIG. 4 is a plan view of a portion of a memory cell array.

FIG. 4 is a top view of a portion of an array of NAND flash memory cells. The array includes bit lines 350 and word lines 352. FIG. 4 shows the epitaxial regions 326 above bit lines 350 and between word lines 352. Each of the epitaxial regions 326 are position in the active areas of the array between two adjacent floating gates stacks. Note that FIG. 4 does not show all of the other details of the flash memory cells.

FIG. 5 is a flow chart describing one embodiment of a portion of the process for manufacturing the memory cell of FIG. 2. This flow chart does not most implant steps, the gap fill of etched volumes between the stacks, or forming the contacts, metallizations, vias, and passivation, as well as other portions of the manufacturing process known in the art. There are many ways to manufacture memory according to the present invention and, thus, the inventors contemplate that various methods other than that described by FIG. 5 can be used. While a flash memory chip will include core memory and peripheral circuitry, the process steps of FIG. 5 are intended only to describe in general terms one possible process recipe for the fabrication of the core memory array. Many photolithography, etch, implant, diffusion and oxidation steps, which are well know by those skilled in the art, that are intended for the fabrication of the peripheral transistors are omitted.

Figure 6A:
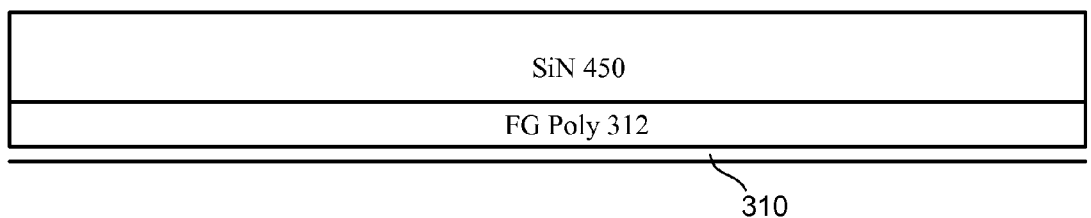
FIGS. 6A-G depict a portion of a non-volatile memory cell array at various stages of the process described in FIG. 5.

Step 402 of FIG. 5 includes growing tunnel oxide on top of a P-Well. The tunnel oxide corresponds to dielectric layer 310. In step 404, the polysilicon floating gate is deposited over dielectric layer 310 using CVD, PVD, ALD or another suitable method. In step 406, a SiN layer is deposited. The results of step 402-6 are depicted in FIG. 6A, which shows dielectric layer 310, polysilicon layer 312 and SiN layer 450.

Step 408 of FIG. 5 includes depositing a hard mask on the active areas (e.g., along the NAND strings) using, for example, CVD, to deposit $SiO_2$ or $Si_3N_4$. Photolithography is used to form strips of photoresist over what will become the NAND strings. Step 410 includes etching through the nitride, polysilicon and oxide layers, as well as part of the silicon substrate, in order to define the active areas. The hard mask is etched through using anisotropic plasma etching, (i.e., reactive ion etching with the proper balance between physical and chemical etching for each planar layer encountered). After the hard mask layer is etched into strips, the photoresist can be stripped away and the hard mask layer can be used as the mask for etching the underlying layers. The process, then includes etching through the floating gate material, the oxide material and approximately 0.2 microns into the substrate to create shallow trench isolation (STI) areas between the NAND strings, where the bottom of the trenches are inside the top of the P-well.

In step 412, the trenches are filled with $SiO_2$ (or another suitable material) up to the top of the hard mask using CVD, rapid ALD or another method. In step 414, Chemical Mechanical Polishing (CMP), or another suitable process, is used to polish the material flat until reaching the SiN.

Figure 6B:
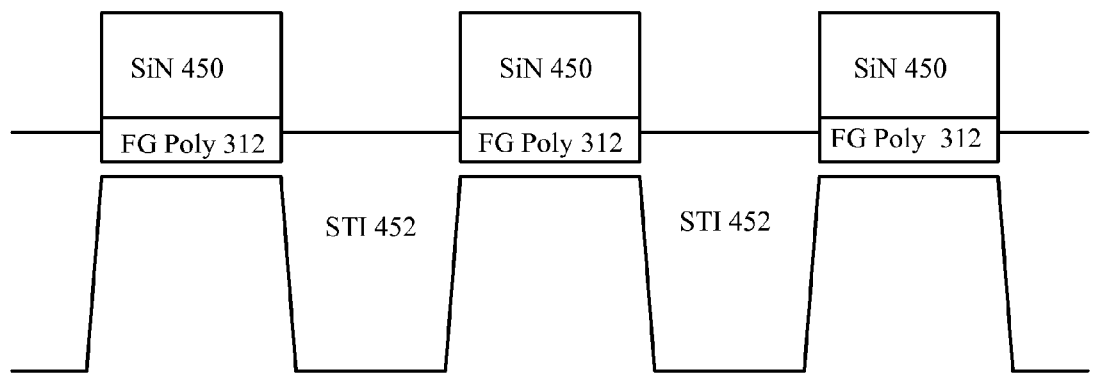

FIG. 6B depicts a cross section of the memory array along cut A of FIG. 4 after step 414. More specifically, FIG. 6B shows trenches 452 filled with $SiO_2$ as well as the polysilicon floating gate layer 312 and the SiN layer etched as described above to form strips along the NAND string.

Figure 6C:
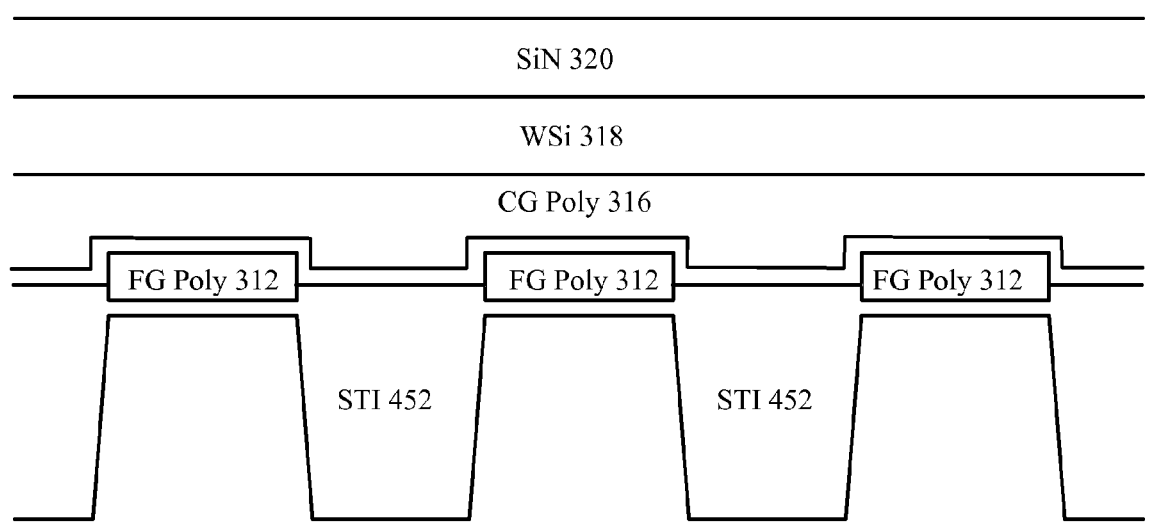

In step 416, the SiN layer is stripped. In step 418, the inter-poly dielectric (e.g., dielectric 314) is grown or deposited. For example, an Oxide Nitride Oxide (ONO) inter-poly dielectric is used. In step 420, the control gates (word lines) are deposited. Step 420 includes depositing poly-silicon layer 316, Tungsten Silicide (WSi) layer 318 and Silicon Nitride (SiN) layer 320. FIG. 6C depicts a cross section of the memory array along cut A of FIG. 4 after step 420.

Figure 6D:
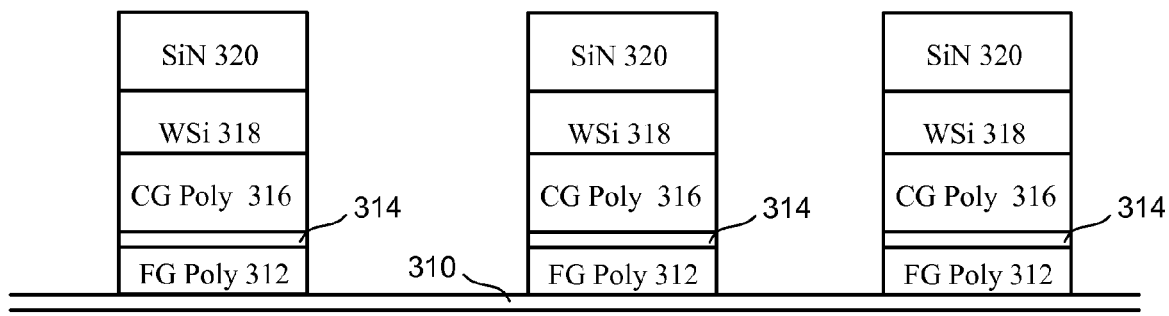

In step 422, photolithography is used to create patterns of strips perpendicular to the NAND chain, in order form word lines that are isolated from one another. In step 424, etching is performed using plasma etching, ion milling, ion etching that is purely physical etching, or another suitable process to etch the various layers and form the individual word lines. In one embodiment, the etching is performed through Silicon Nitiride (SiN) layer 320, Tungsten Silicide (WSi) layer 318, poly-silicon layer 316, ONO layer 314 and polysilicon layer 312. In another embodiment, the process will etch all the way to the substrate. FIG. 6D depicts a cross section of the memory array along cut B of FIG. 4 after step 424.

In step 426, sidewall oxidation, sidewall oxide deposition, or a combination of the two is performed. For sidewall oxidation, the device is placed in a furnace at a high temperature and with some fractional percentage of ambient oxygen gas, so that the exposed surfaces oxidize, which provides a protection layer. Sidewall oxidation can also be used to round the edges of the floating gate and the control gate. An alternative to high temperature (e.g., over 1000 degrees Celsius) oxide growth is low temperature (e.g., 400 degrees Celsius) oxide growth in high density Krypton plasma. More information about sidewall oxidation can be found in "New Paradigm of Silicon Technology," Ohmi, Kotani, Hirayama and Morimoto, Proceedings of the IEEE, Vol. 89, No. 3, March 2001; "Low-Temperature Growth of High Silicon Oxide Films by Oxygen Radical Generated in High Density Krypton Plasma," Hirayama, Sekine, Saito and Ohmi, Dept. of Electronic Engineering, Tohoku University, Japan, 1999 IEEE; and "Highly Reliable Ultra thin Silicon Oxide Film Formation at Low Temperature by Oxygen Radical Generated in High-Density Krypton Plasma," Sekine, Saito, Hirayama and Ohmi, Tohoku University, Japan, 2001 IEEE; all three of which are incorporated herein by reference in their entirety.

Figure 6E:
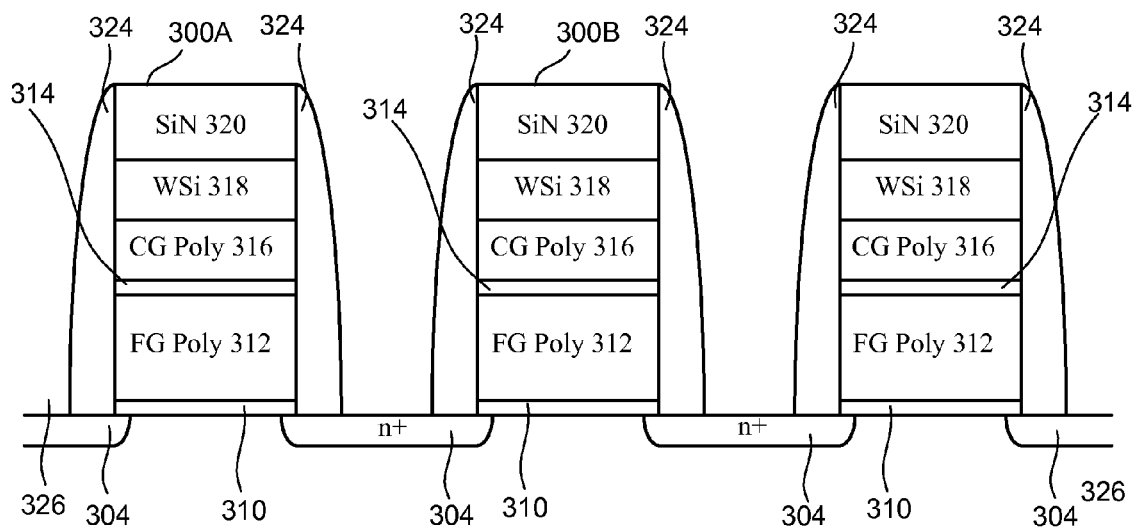

In step 428, an implant process is performed to create the N+ source/drain regions. Arsenic or phosphorous implantation can be used. In one embodiment, a halo implant is also used. In some embodiments, an anneal process is performed. Step 430 includes depositing oxide spacer material. In one embodiment, an isotropic deposition process can be used. In step 432 the oxide spacer material is etched so that it is removed from the horizontal surfaces but not the vertical surfaces. In one embodiment, an aniotropic etching process is used to form sidewall oxide spacers 324. FIG. 6E depicts a cross section of the memory array along cut B of FIG. 4 after step 432.

Figure 6F:
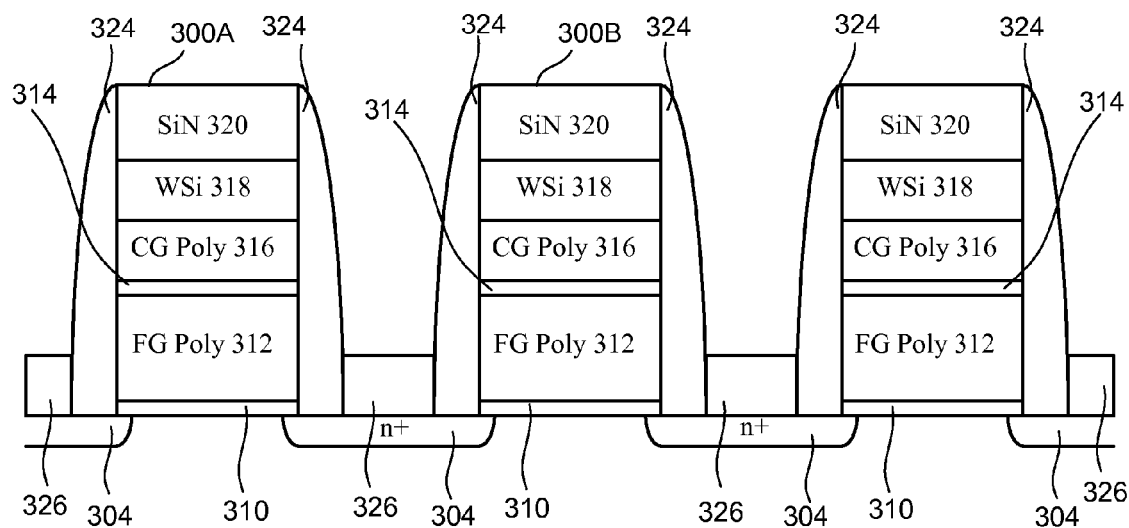

After step 432, silicon is exposed at the source/drain regions 304. In step 434, a selective epitaxial process grows a layer of silicon on the exposed source/drain regions 304. In one embodiment, the epitaxial silicon layer is 600 Å. Silicon can be grown epitaxially at temperatures of 500-650 C. The process is selective because the epitaxial silicon layer will grow on silicon, but will not grow on oxide or nitride. Therefore, the epitaxial silicon layer will grow on source/drain regions 304, but will not grow in the trenches or on SiN layer 320. Therefore, the epitaxial layers are positioned between the floating gate stacks and in the active regions only. Since there is no epitaxial growth over the trenches, bit line to bit line shorts are avoided. Since the epitaxial silicon layer will only grow on source/drain regions 304, the shield created by the epitaxial silicon layer is self aligned. Because the shield created by the epitaxial silicon layer is electrically connected to source/drain regions 304, no additional contacts or signal routing is required. FIG. 6F depicts a cross section of the memory array along cut B of FIG. 4 after step 434.

Figure 6G:
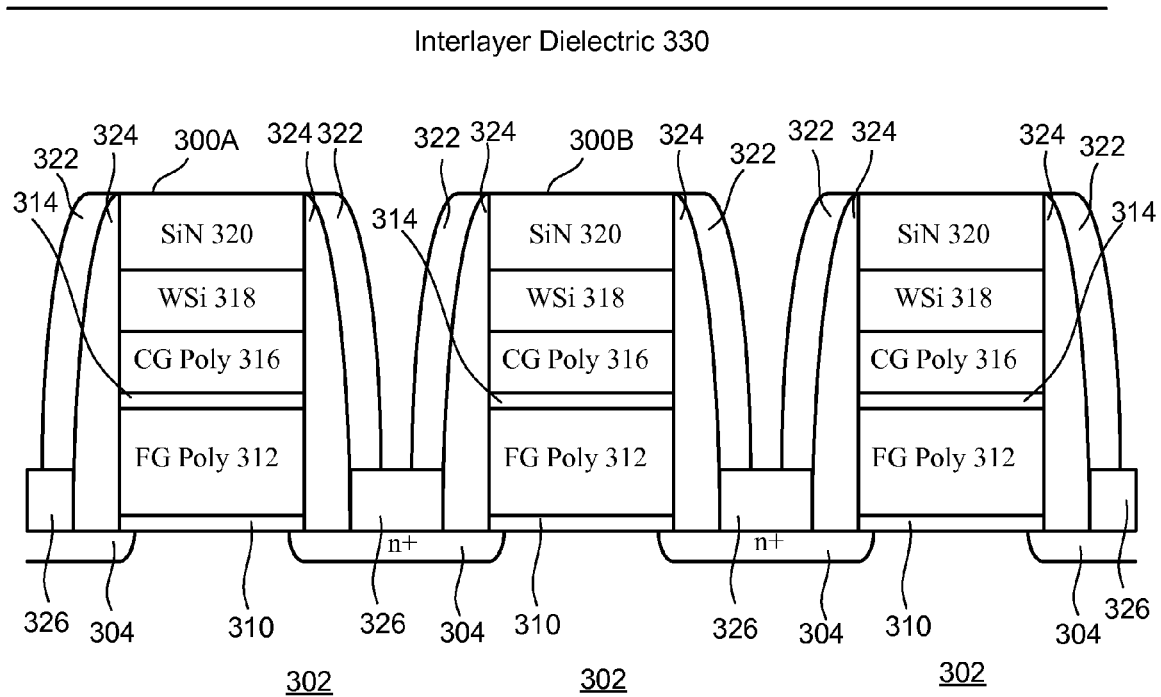

Step 436 includes deposition of nitride spacer material and step 438 includes etching the nitride spacer material to form nitride spacer 322. Step 440 includes depositing inter-layer dielectric material 330 to fill-in the array and planarizing the surface. FIG. 6G depicts a cross section of the memory array along cut B of FIG. 4 after step 440. Step 442 represent etching contacts, depositing metal to form interconnects and other backend processes.

In the above examples, the substrate is made of silicon. However, other materials known in the art can also be used such as Gallium Arsenide, etc.

There are many alternatives to the above described structures and processes within the spirit of the present invention. As in the existing NAND embodiments, an alternative is to fabricate the memory cells from PMOS devices with opposite polarity bias conditions for the various operations as compared to the existing NMOS implementation. Note also that the oxide spacer etch can be performed in the periphery if the epitaxial layer is desired for periphery devices or it can be masked if it is not.

Figure 7:
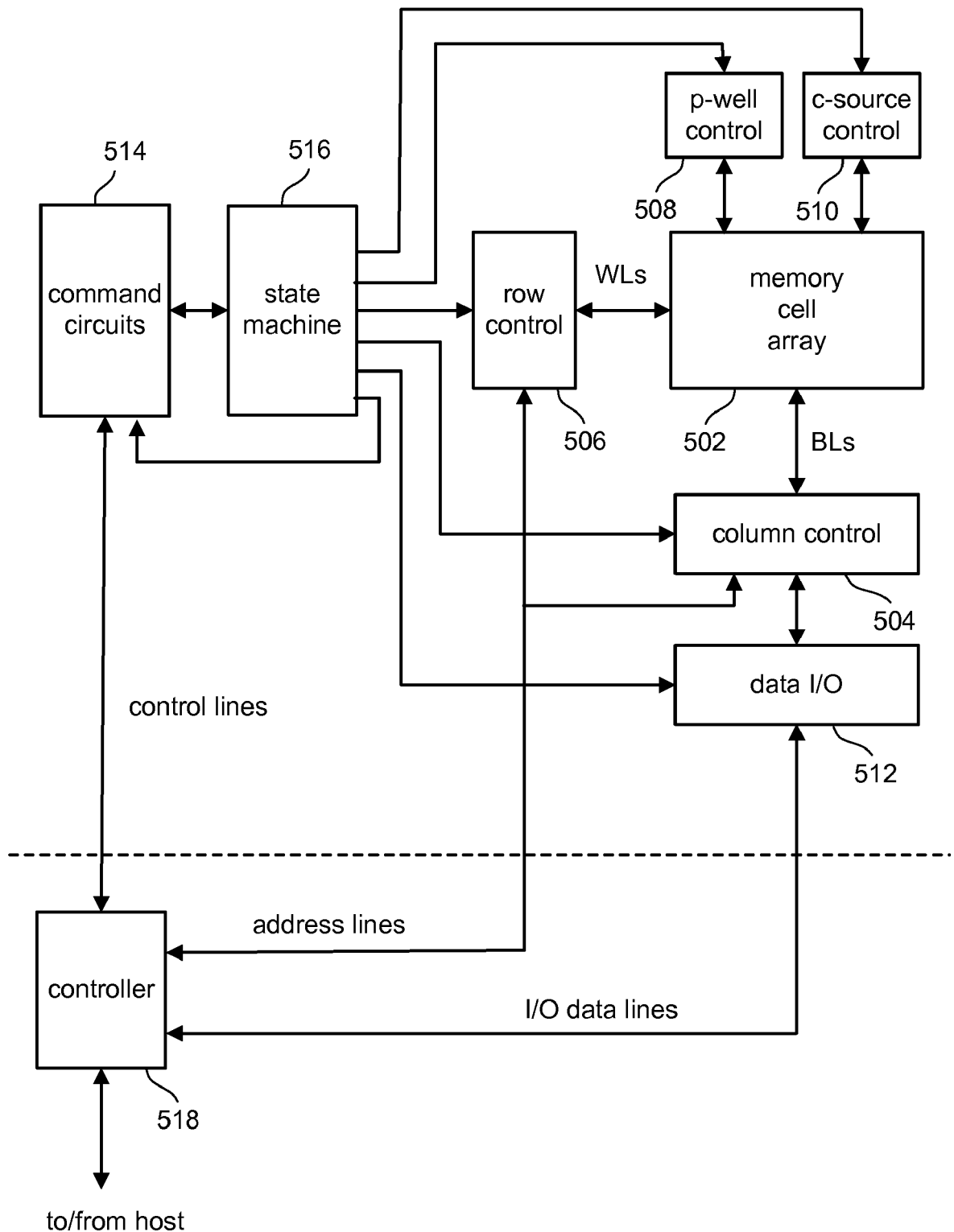
FIG. 7 is a block diagram of one example of a memory system that can be used to implement the present invention.

FIG. 7 is a block diagram of one embodiment of a flash memory system that can be used to implement the present invention. Memory cell array 502 is controlled by column control circuit 504, row control circuit 506, c-source control circuit 510 and p-well control circuit 508. Column control circuit 504 is connected to the bit lines of memory cell array 502 for reading data stored in the memory cells, for determining a state of the memory cells during a program operation, and for controlling potential levels of the bit lines to promote the programming or to inhibit the programming. Row control circuit 506 is connected to the word lines to select one of the word lines, to apply read voltages, to apply program voltages and to apply an erase voltage. C-source control circuit 510 controls a common source line (labeled as "C-source" in FIG. 12) connected to the memory cells. P-well control circuit 508 controls the p-well voltage during erase operations to, for example, apply positive voltages to the P-well while the word lines of a block that is selected for an erase operation are grounded.

The data stored in the memory cells are read out by the column control circuit 504 and are output to external I/O lines via data input/output buffer 512. Program data to be stored in the memory cells are input to the data input/output buffer 512 via the external I/O lines, and transferred to the column control circuit 504. The external I/O lines are connected to controller 518.

Command data for controlling the flash memory device is input to controller 518. The command data informs the flash memory of what operation is requested. The input command is transferred to state machine 516, which controls column control circuit 504, row control circuit 506, c-source control 510, p-well control circuit 508 and data input/output buffer 512. State machine 516 can also output status data of the flash memory such as READY/BUSY or PASS/FAIL.

Controller 518 is connected or connectable with a host system such as a personal computer, a digital camera, personal digital assistant, etc. Controller 518 communicates with the host in order to receive commands from the host, receive data from the host, provide data to the host and provide status information to the host. Controller 518 converts commands from the host into command signals that can be interpreted and executed by command circuits 514, which is in communication with state machine 516. Controller 518 typically contains buffer memory for the user data being written to or read from the memory array.

One exemplar memory system comprises one integrated circuit that includes controller 518, and one or more integrated circuit chips that each contain a memory array and associated control, input/output and state machine circuits. The trend is to integrate the memory arrays and controller circuits of a system together on one or more integrated circuit chips. The memory system may be embedded as part of the host system, or may be included in a memory card (or other package) that is removably inserted into the host systems. Such a removable card may include the entire memory system (e.g., including the controller) or just the memory chip(s) and associated peripheral circuits (with the Controller being embedded in the host). Thus, the controller can be embedded in the host or included within a removable memory system.

In some implementations, some of the components of FIG. 7 can be combined. In various designs, all or some of the components of FIG. 7, other than memory cell array 502, can be thought of as managing circuits or a managing circuit. For example, the state machine, the controller, row/column controls, other components of FIG. 7 or a combination of the above can be thought of as managing circuits.

In one embodiment of the present invention, NAND type flash memory cells are used. The discussion herein is not limited to any particular number of memory cells in a NAND string or NAND chain. Furthermore, the present invention is not limited to NAND flash memory cells. In other embodiments flash memory cells other than NAND cells (e.g., NOR cells or other cells) can be used to implement the present invention. In yet other embodiments, non-volatile memory cells other than flash memory cells can be used to implement the present invention.

Figure 8:
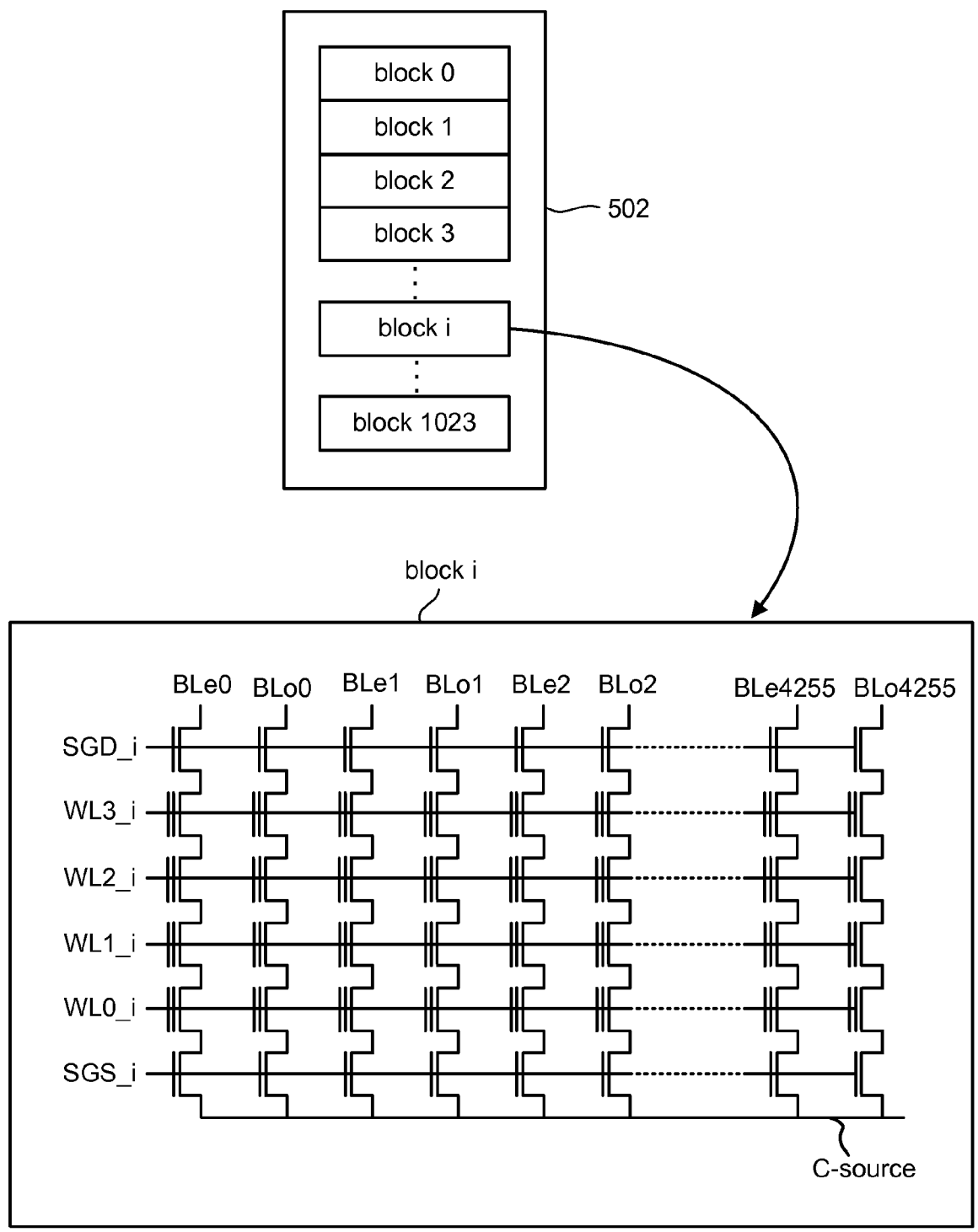
FIG. 8 illustrates an example of an organization of a memory array.

FIG. 8 depicts an example of an organization of memory cell array 502, using NAND memory cells. Memory cell array 502 is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 8 shows four memory cells connected in series to form a NAND string. Although four cells are shown to be included in each NAND string, more or less than four memory cells can be used. One terminal of the NAND string is connected to corresponding bit line via a first select transistor SGD, and another terminal is connected to c-source via a second select transistor SGS.

During read and programming operations, 4,256 memory cells are simultaneously selected. The memory cells selected have the same word line and the same kind of bit line (e.g., even bit lines or odd bit lines). Therefore, 532 bytes of data can be read or programmed simultaneously. In one embodiment, these 532 bytes of data that are simultaneously read or programmed form a logical page. Therefore, one block can store at least eight logical pages (four word lines, each with odd and even pages). When each memory cell stores two bits of data (e.g., a multi-state memory cell), one block stores 16 logical pages. Other sized blocks and pages can also be used with the present invention. Additionally, architectures other than that of FIGS. 7 and 8 can also be used to implement the present invention.

In the read and verify operations, the select gates (SGD and SGS) and the unselected word lines (e.g., WL0, WL1 and WL3) are raised to a read pass voltage (e.g., 4.5 volts) to make the transistors operate as pass gates. The selected word line (e.g., WL2) is connected to a voltage, a level of which is specified for each read and verify operation in order to determine whether a threshold voltage of the concerned memory cell has reached such level. For example, in a read operation for a two level memory cell, the selected word line WL2 may be grounded, so that it is detected whether the threshold voltage is higher than 0V. In a verify operation for a two level memory cell, the selected word line WL2 is connected to 2.4V, for example, so that it is verified whether the threshold voltage has reached at least 2.4V. The source and p-well are at zero volts. The selected bit lines (BLe) are pre-charged to a level of, for example, 0.7V. If the threshold voltage is higher than the read or verify level on the word line, the potential level of the concerned bit line (BLe) maintains the high level because of the non-conductive memory cell. On the other hand, if the threshold voltage is lower than the read or verify level, the potential level of the concerned bit line (BLe) decreases to a low level by the end of sensing integration time, for example less than 0.3V, because of the conductive memory cell. The state of the memory cell is, thereby, detected by a sense amplifier that is connected to the bit line.

The erase, read and verify operations described above are performed according to techniques known in the art. Thus, many of the details explained can be varied by one skilled in the art. Other read and verify techniques known in the art can also be used.

Figure 9:
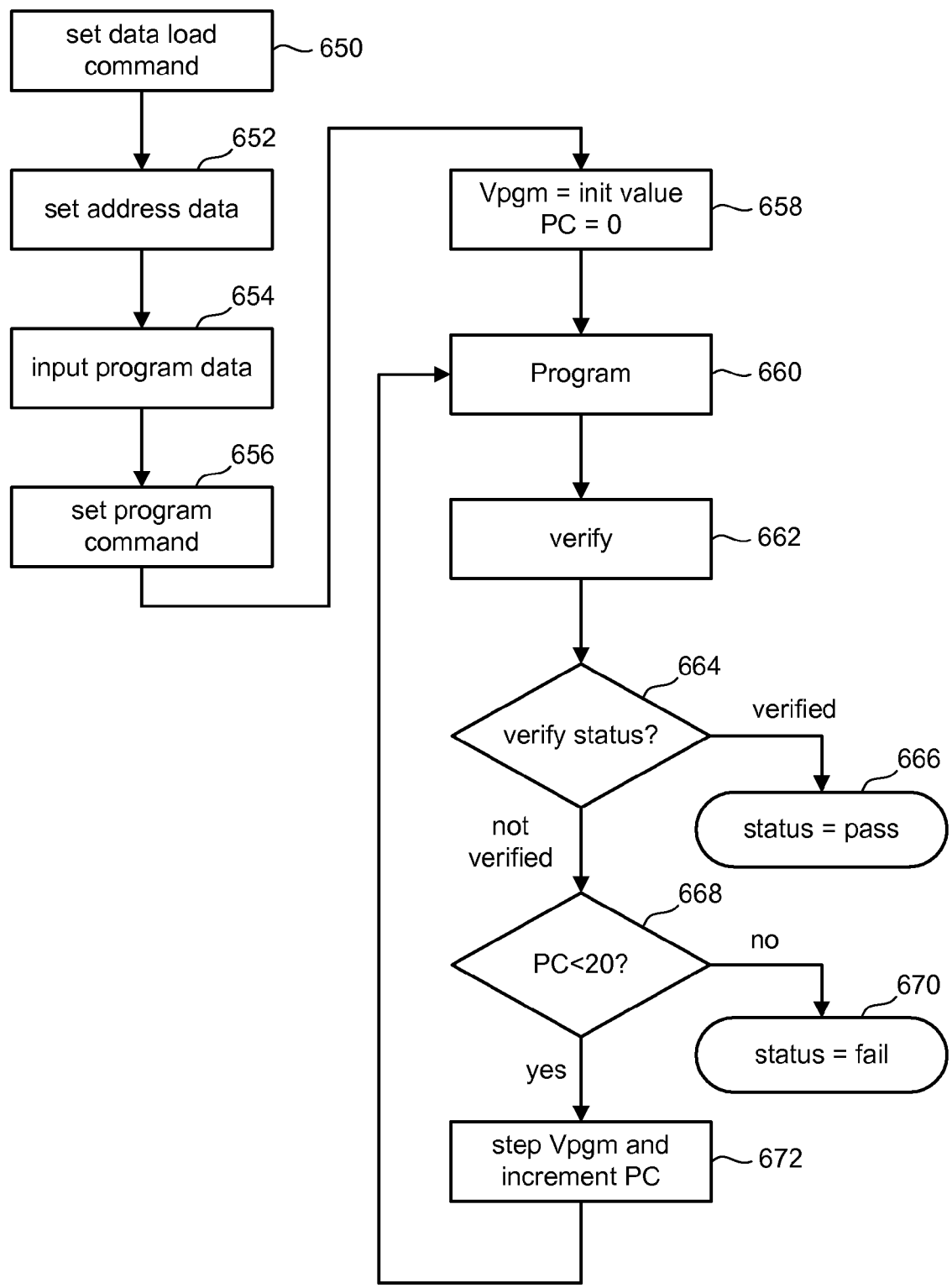
FIG. 9 is a flow chart describing one embodiment of a process for programming non-volatile memory devices.

FIG. 9 is a flow chart describing one embodiment for programming one or more memory cells of array 502. In step 650, the operation starts by receiving a data load command from the host and placing that data load command in the state machine. In step 652, address data is received from the host and stored in the state machine in order to select the page to be used for the write operation. In step 654, the data to be written is received and stored. In step 656, a program command is received from the host and that program command is stored in the state machine. In one embodiment, after the program command is stored in the state machine, the operation of the subsequent steps are automatically started by the state machine.

In step 658, the initial value of the program voltage Vpgm is set (e.g., 7-12 volts; however, other values can also be used). Typically, the program voltage applied to the control gate is applied as a series of pulses. The magnitude of the pulses is increased with each successive pulse by a predetermined step size (e.g., 0.2 V). In the periods between the pulses, verify operations are carried out. That is, the programming level of each cell of a group of cells being programmed in parallel is read between successive programming pulses to determine whether it is equal to or greater than a verify level to which it is being programmed. The cells that are verified to be sufficiently programmed are locked out, for example in NAND cells, by raising the bit line voltage from 0 to Vdd (e.g., 2.5 V) to stop the programming process for those cells. In some cases, the number of pulses will be limited (e.g., 20 pulses) and if a given memory cell is not completely programmed by the last pulse, then an error is assumed. In some implementations, memory cells are erased (in blocks or other units) prior to programming.

Figure 10:
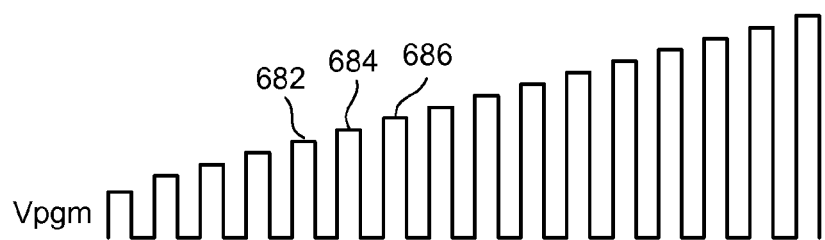
FIG. 10 depicts a program voltage signal.

FIG. 10 shows a program voltage signal Vpgm that is applied to the control gates of flash memory cells. The program voltage signal Vpgm includes a series of pulses that increase in magnitude over time. At the start of the program pulses, the bit lines (e.g., connected to the drain) of all cells that are to be programmed are grounded, thereby, creating a voltage difference of Vpgm–0V from gate to channel. Once a cell reaches the targeted voltage, the respective bit line voltage is raised to Vdd so that the memory cell is in the program inhibit mode (e.g., program to that cell stops).

Figure 11:
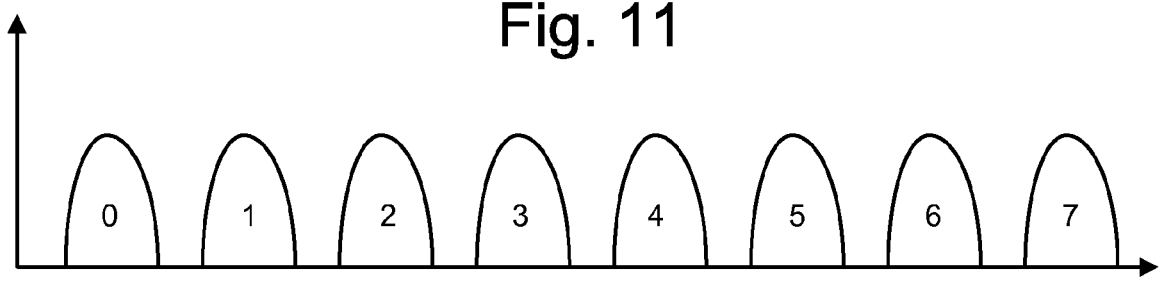
FIG. 11 depicts memory cell threshold distributions for multi-state memory cells.

A multi-state flash memory cell is implemented by identifying multiple, distinct allowed threshold voltage ranges separated by forbidden voltage ranges. For example, FIG. 11 shows eight threshold ranges (0, 1, 2, 3, 4, 5, 6, 7), corresponding to three bits of data. Other memory cells can use more than eight threshold ranges or less than eight threshold ranges. Each distinct threshold voltage range corresponds to predetermined values for the set of data bits. In one implementation the logical data corresponds to the eight states as follows (however, other schemes can be used):

| Physical State | Data |
|---|---|
| 0 | 000 |
| 1 | 001 |
| 2 | 011 |
| 3 | 010 |
| 4 | 110 |
| 5 | 111 |
| 6 | 101 |
| 7 | 100 |

In some implementations, these data values (e.g., logical states) are assigned to the threshold ranges using a gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the cells. For example, U.S. Pat. No. 6,222,762 and U.S. patent application Ser. No. 10/461,244, "Tracking Cells For A Memory system," filed on Jun. 13, 2003, (now U.S. Pat. No. 7,237,074) both of which are incorporated herein by reference in their entirety, describe various data encoding schemes for multi-state flash memory cells.

In one embodiment, the multi-state memory cell is erased by lowering the threshold voltage of that memory cell so that the threshold voltage is within threshold voltage range 0 of FIG. 11. The multi-state memory cell is programmed by raising the threshold voltage of that memory cell so that the threshold voltage is within one of threshold voltage ranges 1-7 of FIG. 11, depending on the data to be programmed. Thus, in the example above, if a memory cell is to be programmed with the data "101" then that memory cell will have its threshold voltage raised so that it is within threshold voltage 6 of FIG. 11.

Figure 12:
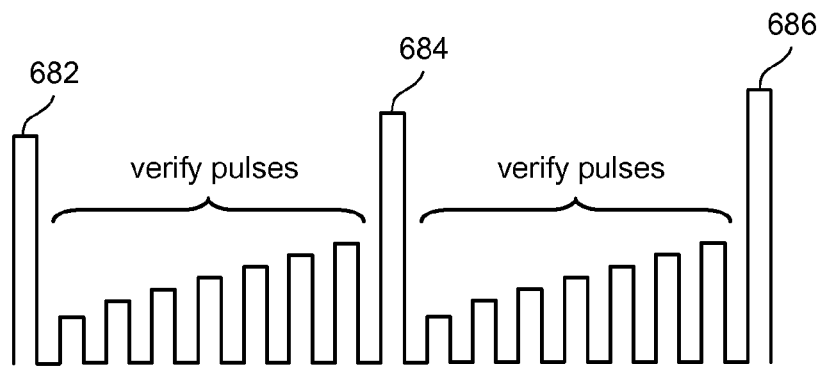
FIG. 12 depicts a portion of the program voltage signal of FIG. 10, with verify pulses.

As described above, between the programming pulses the memory cells are verified to see if they reached the target threshold value. For arrays of multi-state flash memory cells, the memory cells will perform a verification step of each state to determine which state the memory cell is within. For example, a multi-state memory cell capable of storing data in eight states may need to perform verify operations for seven compare points. FIG. 12 shows three programming pulses 682, 684 and 686 (each of which are also depicted in FIG. 10). Between the programming pulses are seven verify pulses in order to perform seven verify operations. Based on the seven verify operations, the system can determine the state of the memory cells. Performing seven verify operations after each programming pulses slows down the programming process. One means for reducing the time burden of verifying is to use a more efficient verify process. For example, in U.S. patent application Ser. No. 10/314,055, "Smart Verify for Multi-State Memories," filed Dec. 5, 2002, (U.S. Pat. No. 7,073,103) incorporated herein by reference in its entirety, a Smart Verify process is disclosed.

Looking back at FIG. 9, step 658 also includes initializing the program counter (PC) to 0. In step 660, the next program pulse is applied to the control gate (word line) of the memory cell. In step 662, the memory cell is verified to determine if its threshold voltage has reached the target level. If, in step 664, the verification process passes (because the threshold voltage has reached the target), then the programming process has completed successfully for that memory cell (step 666) and the bit line is raised to Vdd for that memory cell. If the verification process did not pass (step 664), then it is determined whether the program counter is less than twenty (step 668). If the program counter is not less than twenty, then the programming process has failed (step 670). If the program counter is less than twenty, then in step 672 the program voltage is increased by the step size (e.g., 0.2 volts, 0.4 volts, or another suitable value) and the program counter is incremented. After step 672, the process loops back to step 660.

In one embodiment, a memory cell is programmed from the erased state directly to any of the programmed states, depending on the data to be stored. In another embodiment, the bits of data stored in a memory cell are for different logical pages and the program process is performed in multiple phases, with one programming phase for each logical page. If the memory cell has three bits, one bit is for a first logical page, a second bit is for a second logical page and a third bit is for a third logical page.

Figure 13:
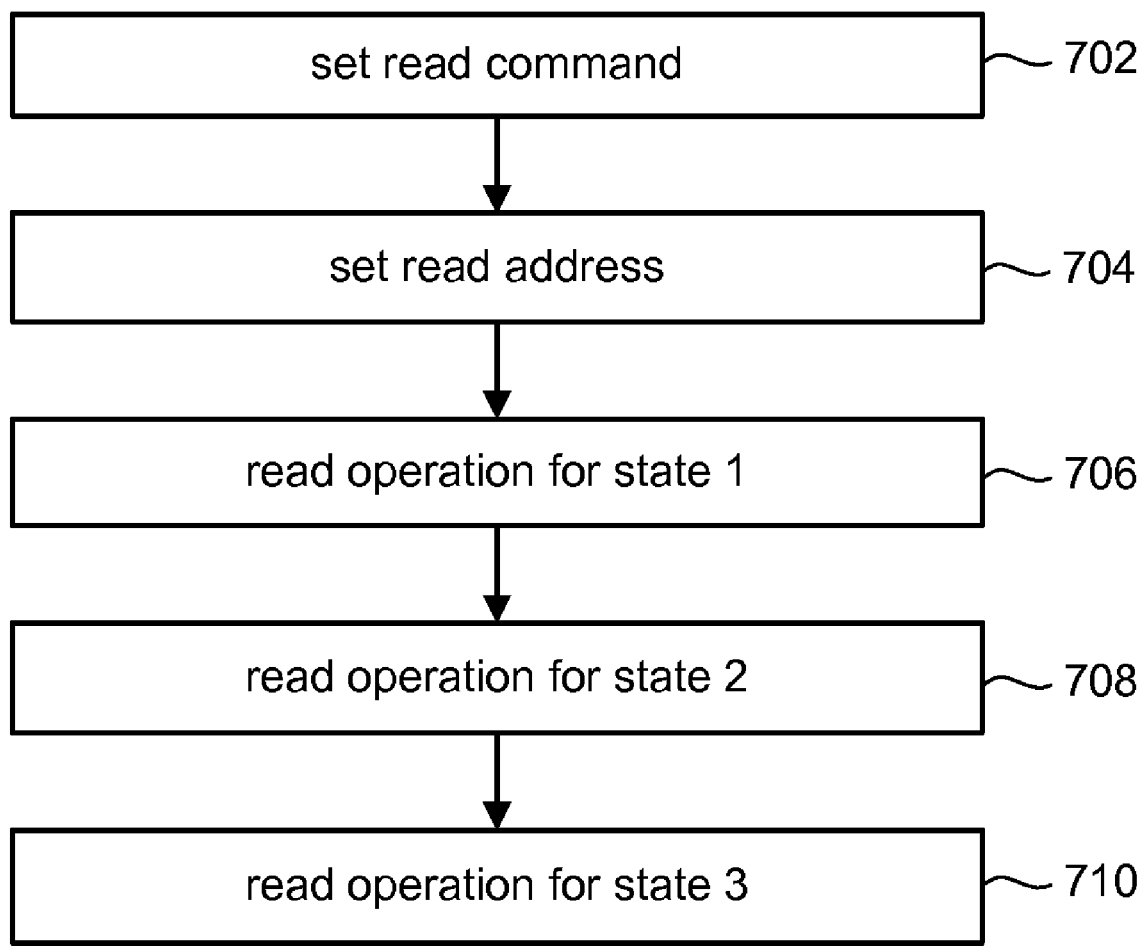
FIG. 13 is a flow chart describing one embodiment of a process for reading non-volatile memory devices.

If the memory cell has two bits of data, one bit is for a lower logical page and the other bit is for an upper logical page. During the first phase of the programming process for the memory cell having two bits of data, data is programmed for the lower logical page. During the second phase of the programming process for the memory cell having two bits of data, data is programmed for the upper logical page. More information about such programming techniques can be found in U.S. patent application Ser. No. 10/629,068, titled "Detecting Over Programmed Memory," filed on Jul. 29, 2003, (U.S. Pat. No. 6,917,542) which is incorporated herein by reference in its entirety. Various other methods for programming can also be used with the present invention, FIG. 13 is a flow chart describing one embodiment of a process for reading a memory cell in array 502. In step 702, a read command is received from the host and stored in the state machine. In step 704, an address is received and stored. The process of FIG. 13 assumes a four state memory cell, with an erased state and three programmed states. For example, the erased state 0 may correspond to range 0 of FIG. 11, and programmed states 1-3 may correspond to ranges 1-3 of FIG. 11. In one embodiment, three read operations are performed in order to read the data stored in the memory cell. If the memory has eight states, then seven read operations are performed; if the memory has sixteen states, then fifteen read operations are performed, etc. In step 706, the first read operation is performed. A first read compare point equivalent to a threshold voltage between state 0 and state 1 is applied to the selected word line, and the sense amplifier on each bit line makes a binary decision as to whether the cell at the intersection of the selected word line and the corresponding bit line is on or off. If the cell is detected to be on, then it is read as being in state 0, otherwise the cell is in state 1, 2 or 3. In other words, if the threshold voltage of the memory cell is less than the first read compare point, the memory cell is assumed to be in the erased state 0.

In step 708, the second read operation is performed. A second read compare point equivalent to a threshold voltage between state 2 and state 1 is applied to the selected word line, and the sense amplifier on each bit line makes a binary decision as to whether the cell at the intersection of the selected word line and the corresponding bit line is on or off. An "on" bit line indicates that the corresponding memory cell is either in state 0 or in state 1. An "off" bit line indicates that the corresponding memory cell is in either state 2 or state 3.

In step 710, the third read operation is performed. A third read compare point equivalent to a threshold voltage between state 3 and state 2 is applied to the selected word line, and the sense amplifier on each bit line makes a binary decision as to whether the cell at the intersection of the selected word line and the corresponding bit line is on or off. An "on" bit line will indicate that the corresponding cell is either in state 0, in state 1, or in state 2. An "off" bit line will indicate that the corresponding memory cell is in state 3. The information obtained during the three sequential steps explained above is stored in latches. A decoder is used to combine the results of the three read operations in order to find the state of each cell. For example, state 1 would be a result of the following three read results: off in step 706, on in step 708, and on in step 710. Note that other read processes can also be used with the present invention.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A NAND string in a non-volatile memory system, the NAND string comprising:
    a set of floating gate stacks arranged on a substrate and connected in series via source/drain regions of the substrate, each floating gate stack comprising a control gate above a floating gate;
    epitaxial regions of the substrate arranged between adjacent floating gate stacks, each respective epitaxial region extends from a respective source/drain region of the substrate to a height which is above a bottom of the floating gates; and
    insulating material covering each epitaxial region so that the epitaxial regions do not have any electrical connection other than to the source/drain regions, the insulating material comprises a deposited dielectric material.

2. The NAND string in a non-volatile memory system of claim 1, wherein:
    the insulating material comprises sidewall insulating material on sidewalls of the floating gate stacks, the epitaxial regions are positioned between the sidewall insulating material of adjacent floating gate stacks, and the deposited dielectric material covers top portions of the epitaxial regions.

3. The NAND string in a non-volatile memory system of claim 1, wherein:
    the insulating material comprises: a) first spacers at sidewalls of the floating gate stacks, the epitaxial regions extend upwards between the first spacers, the first spacers contact the respective source/drain regions and extend from the respective source/drain regions to, and taper toward, tops of the floating gate stacks, and b) second spacers along the first spacers, bottom portions of the second spacers contact the epitaxial regions, and the second spacers extend from the epitaxial regions to, and taper toward, the tops of the floating gate stacks.

4. The NAND string in a non-volatile memory system of claim 3, wherein:
    the deposited dielectric material fully covers top portions of each epitaxial region which are not contacted by the second spacers.

5. The non-volatile memory system of claim 3, wherein:
    the bottom portions of the second spacers contact top portions of the epitaxial regions.

6. The NAND string in a non-volatile memory system of claim 1, wherein:
    the height to which each respective epitaxial region extends is below a top portion of the floating gates.

7. A non-volatile memory system, comprising:
    a set of non-volatile storage elements arranged in series on a substrate, each non-volatile storage element comprising a floating gate;
    an epitaxial portion of the substrate arranged between first and second floating gates of first and second non-volatile storage elements, respectively, the epitaxial portion extends from a source/drain portion of the substrate to a height which is above a bottom of the first and second floating gates; and
    insulating material covering the epitaxial portion so that the epitaxial portion does not have any electrical connection other than to the source/drain portion, the insulating material comprises: a) a first spacer on a sidewall of the first non-volatile storage element, the first spacer extends upward from the source/drain portion, b) a second spacer on a sidewall of the second non-volatile storage element which faces the sidewall of the first non-volatile storage element, the second spacer extends upward from the source/drain portion, and the epitaxial portion extends upward between the first and second spacers, c) a third spacer along the first spacer, and d) a fourth spacer along the second spacer, the third and fourth spacers contact top portions of the epitaxial portion, and e) a deposited dielectric material which fully covers a top portion of the epitaxial portion which is not contacted by the third and fourth spacers.

8. The non-volatile memory system of claim 7, wherein:
    the first and third sidewall spacers extend to, and taper toward, a top of the first non-volatile storage element, and the second and fourth sidewall spacers extend to, and taper toward, a top of the second non-volatile storage element.

* * * * *